(12) United States Patent
Park et al.

(10) Patent No.: US 6,867,098 B2
(45) Date of Patent: Mar. 15, 2005

(54) METHOD OF FORMING NONVOLATILE MEMORY DEVICE

(75) Inventors: Se-Woong Park, Gyeonggi-do (KR); Dong-Soo Chang, Gyeonggi-do (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 10/682,360

(22) Filed: Oct. 7, 2003

(65) Prior Publication Data

US 2004/0191987 A1 Sep. 30, 2004

(30) Foreign Application Priority Data

Oct. 10, 2002 (KR) .................................. 10-2002-0061719

(51) Int. Cl.[7] .......................................... H01L 21/336
(52) U.S. Cl. ...................... 438/257; 438/197; 438/211; 438/239; 438/243; 438/244; 438/248; 438/253; 438/259; 438/386; 438/391
(58) Field of Search ................................ 438/257, 197, 438/210–211, 239–253, 259, 329, 381–387, 391–396

(56) References Cited

U.S. PATENT DOCUMENTS

| | | | | |
|---|---|---|---|---|
| 5,739,567 A | * | 4/1998 | Wong ......................... | 257/316 |
| 6,060,740 A | * | 5/2000 | Shimizu et al. ............. | 257/314 |
| 6,204,122 B1 | * | 3/2001 | Joo et al. .................... | 438/257 |
| 6,261,905 B1 | * | 7/2001 | Chen et al. .................. | 438/264 |
| 6,403,421 B1 | * | 6/2002 | Ikeda et al. ................. | 438/267 |
| 6,583,008 B2 | * | 6/2003 | Lee et al. .................... | 438/257 |
| 6,635,531 B2 | * | 10/2003 | Kim ............................ | 438/257 |
| 6,635,921 B2 | * | 10/2003 | Yi et al. ...................... | 257/316 |
| 6,642,104 B2 | * | 11/2003 | Chang ......................... | 438/257 |
| 2001/0042882 A1 | * | 11/2001 | Chang et al. ............... | 257/315 |
| 2002/0175381 A1 | * | 11/2002 | Choi et al. .................. | 257/369 |
| 2003/0022446 A1 | * | 1/2003 | Lee et al. .................... | 438/257 |
| 2003/0025151 A1 | * | 2/2003 | Yoo ............................. | 257/315 |
| 2003/0032240 A1 | * | 2/2003 | Yi et al. ...................... | 438/257 |
| 2004/0075123 A1 | * | 4/2004 | Fraboulet et al. ........... | 257/288 |

* cited by examiner

*Primary Examiner*—Matthew Smith
*Assistant Examiner*—Granvill D. Lee, Jr.
(74) *Attorney, Agent, or Firm*—Marger Johnson & McCollom, P.C.

(57) ABSTRACT

Disclosed herein is a method of forming a nonvolatile memory device. The method comprises steps of forming a tunnel insulation pattern and a first floating gate pattern that are sequentially stacked on a semiconductor substrate, and then forming a trench comprising sidewalls aligned with the first floating gate pattern in the semiconductor substrate. Next, a device isolation layer is formed to fill in the trench, and an etch stop layer and a mold layer are sequentially formed on the device isolation layer and on the first floating gate pattern. The mold layer and the etch stop layer are successively patterned to form a groove exposing at least the first floating gate pattern, and a second floating gate pattern is formed to fill in the groove. This method can prevent bridges of floating gate layer that usually occur from regions not being fully etched due to high device integration.

14 Claims, 10 Drawing Sheets

METHOD OF FORMING NONVOLATILE MEMORY DEVICE

CROSS REFERENCE TO RELATED APPLICATIONS

This application claims priority under 35 USC § 119 to Korean Patent Application 2002-61719, filed on Oct. 10, 2002, the contents of which are herein incorporated by reference in their entirety.

BACKGROUND OF THE INVENTION

1. Field of the Invention

The present invention relates generally to a method of forming semiconductor devices and more specifically to a method of forming a nonvolatile memory device.

2. Background of the Invention

Semiconductor memory devices are classified into volatile memory devices and nonvolatile memory devices. Volatile memory devices lose the entire data stored in their memory cells when the power supply is cut. Meanwhile, nonvolatile memory devices sustain data stored in their memory cells even if the power is cut. For example, DRAM and SRAM are types of volatile memory devices, and flash memory device is a type of non-volatile memory device.

The flash memory device can electrically erase and remove data. A stack gate type of flash memory device makes it possible for highly integrated semiconductor devices. The stack gate type flash memory device comprises a tunnel insulation layer, a floating gate electrode, a control gate insulation layer, and a control gate electrode.

Meanwhile, as semiconductor devices become more highly integrated in a chip, there is an increasing need for lower operation voltages and smaller line widths. Accordingly, the coupling ratio of the flash memory device becomes an issue. The coupling ratio is a ratio of induced voltage of the floating gate electrode to operation voltage supplied to the control gate electrode. That is, as the coupling ratio increases, the voltage that is induced to the floating gate electrode by the operation voltage applied to the control gate electrode also increases. As a result, the operational voltage of the flash memory device can be decreased. The coupling ratio can be raised by increasing the capacitance between the floating gate electrode and the control gate electrode. Consequently, methods have been proposed to broaden an area of the floating gate electrode so as to raise the capacitance between it and the control gate electrode.

FIGS. 1–3 are cross-sectional views showing steps of forming a traditional nonvolatile memory device.

Referring to FIG. 1, a buffer oxide layer, a first floating gate conductive layer, and a first hard mask layer, which are not shown in the drawing, are sequentially formed on a semiconductor substrate 1. The first hard mask layer, the first floating gate conductive layer, and the buffer oxide layer are successively patterned to expose a predetermined region of the semiconductor substrate 1, thereby forming a buffer oxide pattern 2, a first floating gate pattern 3, and a first hard mask pattern 4 that are sequentially stacked. The buffer oxide pattern 2 is formed of thermal oxide and the first floating gate pattern 3 is formed of doped polysilicon. Additionally, the first hard mask pattern 4 is formed of silicon nitride. Using the first hard mask pattern 4 as an etch mask, the exposed semiconductor substrate 1 is selectively etched to form a trench 5 having a predetermined depth from the top of the semiconductor substrate.

Referring to FIG. 2, a device isolation insulating layer (not shown) is formed on the surface of the semiconductor substrate 1 to fill in the trench 5. Then, the device isolation insulating layer is planarized until the first hard mask pattern 4 is exposed. This forms a device isolation layer 6 within the trench 5. Next, the exposed first hard mask pattern 4 is etched until the first floating gate pattern 3 is exposed. A second floating gate conductive layer 7 and a second hard mask layer 8 are sequentially formed on the surface of the semiconductor substrate 1 with the exposed first floating gate pattern 3. The second floating gate conductive layer 7 is formed of doped polysilicon and the second hard mask layer 8 is formed of silicon oxide. A photoresist pattern 9 is then formed on the second hard mask layer 8. The photoresist pattern 9 is formed over the first floating gate pattern 3.

Referring to FIG. 3, using the photoresist pattern 9 as a mask, the second hard mask layer 8 is etched to expose the second floating gate conductive layer 7, thereby forming a second hard mask pattern 8a. The photoresist pattern 9 is removed and spacers 10 are formed on both sidewalls of the second hard mask pattern 8a. The spacers are formed of silicon nitride. Using the second hard mask pattern 8a and the spacers 10 as a mask, the second floating gate conductive layer 7 is etched to expose the device isolation layer 6, thereby forming a second floating gate pattern 7a.

According to the above method, the area of the second floating gate pattern 7a is widened by the spacers 10. That is, the surface area of the second floating gate pattern 7a increases by the width of the bottom areas of the spacers 10. However, in region "a" the second floating gate conductive layer 7 may not get completely etched because of the tight dimensions in region "a." This in turn leaves a bridge between the adjacent second floating gate patterns 7a. This bridge may be even more prominent with higher device integration because of even tighter dimensions in region "a."

SUMMARY

Embodiments of the present invention are directed to a method of forming a memory device while preventing bridges, which can occur when the interval distance between the conventional floating gate electrodes is decreased to accommodate higher integration of the devices on a chip.

According to one embodiment, a tunnel insulation pattern and a first floating gate pattern, which are sequentially stacked, are formed on a semiconductor substrate. A trench is formed in the semiconductor substrate. Next, a device isolation layer is formed to fill in the trench. An etch stop layer and a mold layer are sequentially formed on the device isolation layer and on the first floating gate pattern. The mold layer and the etch stop layer are successively patterned to form a groove exposing at least the first floating gate pattern. A second floating gate pattern is then formed to fill the groove.

Specifically, the etch stop layer is preferably formed of a material having an etch selectivity with respect to the device isolation layer and the first floating gate pattern. The mold layer is formed of a material having an etch selectivity with respect to the etch stop layer.

According to one aspect of the present invention, the groove can be formed by the following method. A photoresist pattern is formed on the mold layer, wherein the photoresist pattern includes an opening, which exposes a predetermined region of the mold layer. Using the photoresist pattern as a mask, the mold layer is etched by an isotropic etching process to form a preliminary groove that exposes the etch stop layer overlying the first floating gate pattern. The photoresist pattern is then removed from the semiconductor substrate with the preliminary groove and the etch stop layer exposed in the preliminary groove is etched to form a groove exposing at least the first floating gate pattern. This groove is wider than the opening.

In this embodiment of the present invention, a method of forming the second floating gate pattern comprises forming a second floating gate conductive layer on the surface of the semiconductor substrate to fill in the groove, and then planarizing the second floating gate conductive layer to expose the patterned mold layer. This method thereby forms a second floating gate pattern within the groove.

DETAILED DESCRIPTION

Figure 1:
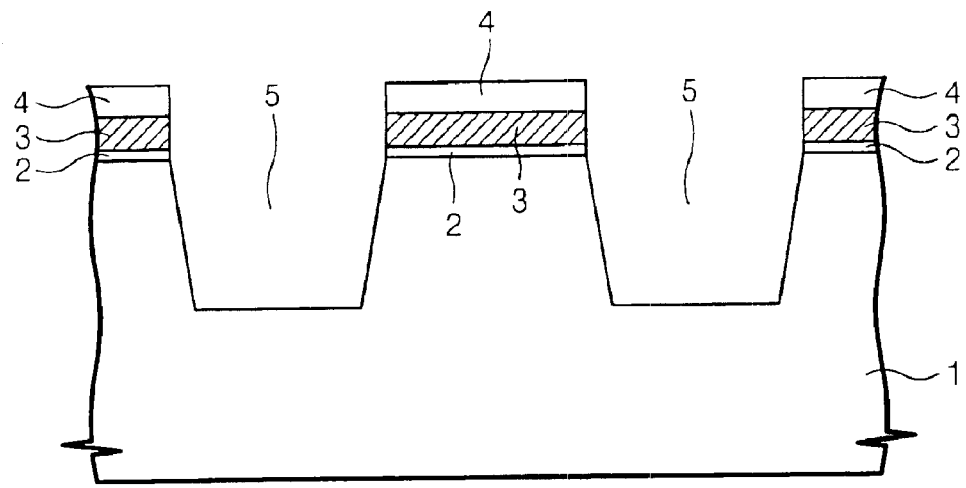
FIGS. 1–3 are cross-sectional views showing steps of forming a conventional nonvolatile memory device.
Figure 2:
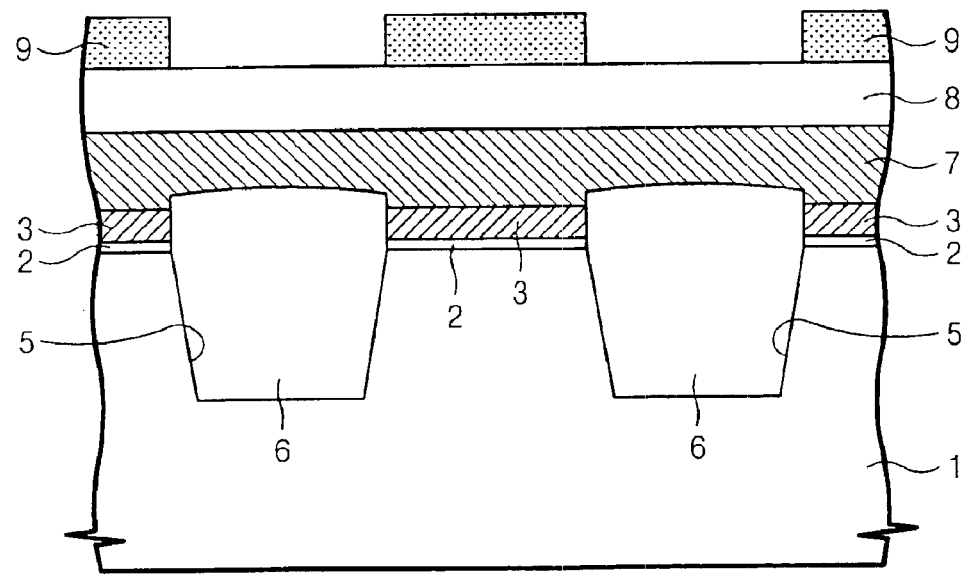
Figure 3:
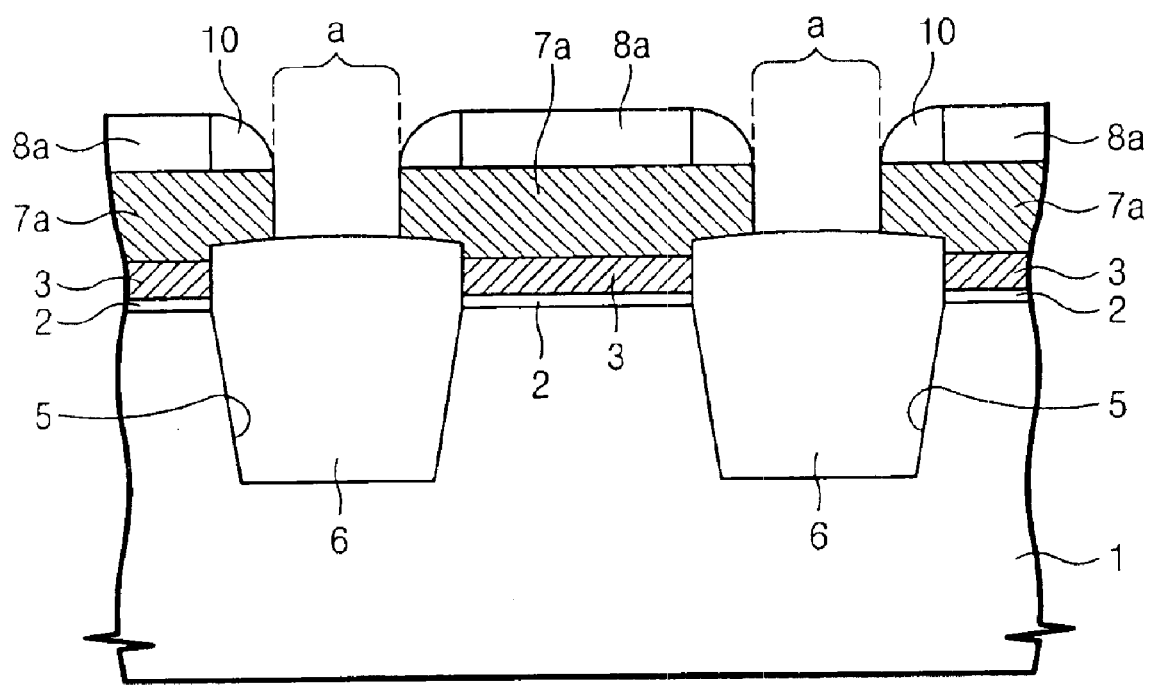

The present invention will be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present.

FIGS. 4–11 are cross-sectional views showing a method of forming a nonvolatile memory device in accordance with an embodiment of the present invention.

Figure 4:
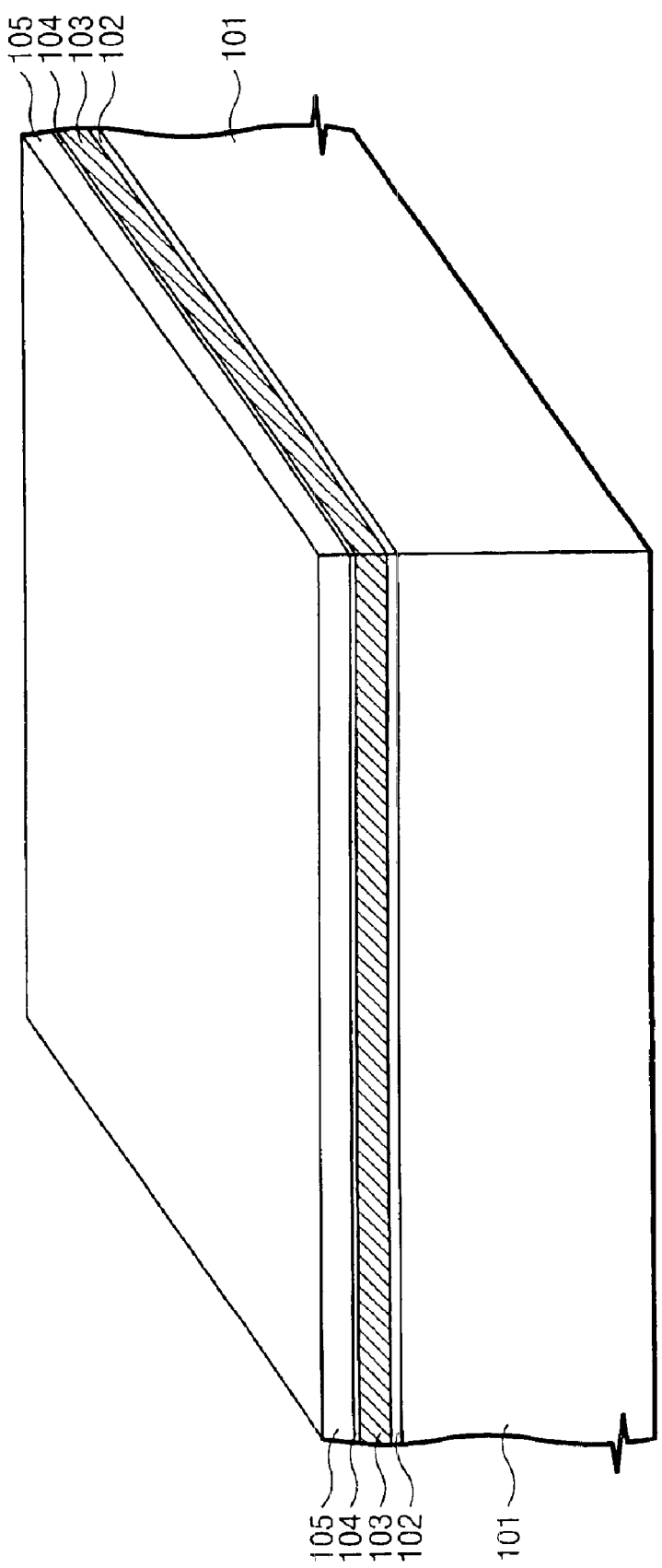
FIGS. 4–11 are cross-sectional views showing a method of forming a nonvolatile memory device in accordance with an embodiment of the present invention.

Referring to FIG. 4, a tunnel insulation layer 102, a first floating gate conductive layer 103, a buffer insulation layer 104, and a hard mask layer 105 are sequentially formed on a semiconductor substrate 101. The tunnel insulation layer 102 may be formed of thermal oxide. The first floating gate conductive layer 103 may be formed of doped polysilicon. The buffer insulation layer 104 serves as a protector of the first floating gate conductive layer 103 from stress of the hard mask layer 105, and may, for example, be formed of CVD silicon oxide. The buffer insulation layer 104 may also be omitted. The hard mask layer 105 may be formed of a material, such as silicon nitride, which has an etch selectivity with respect to the semiconductor substrate 101.

Figure 5:
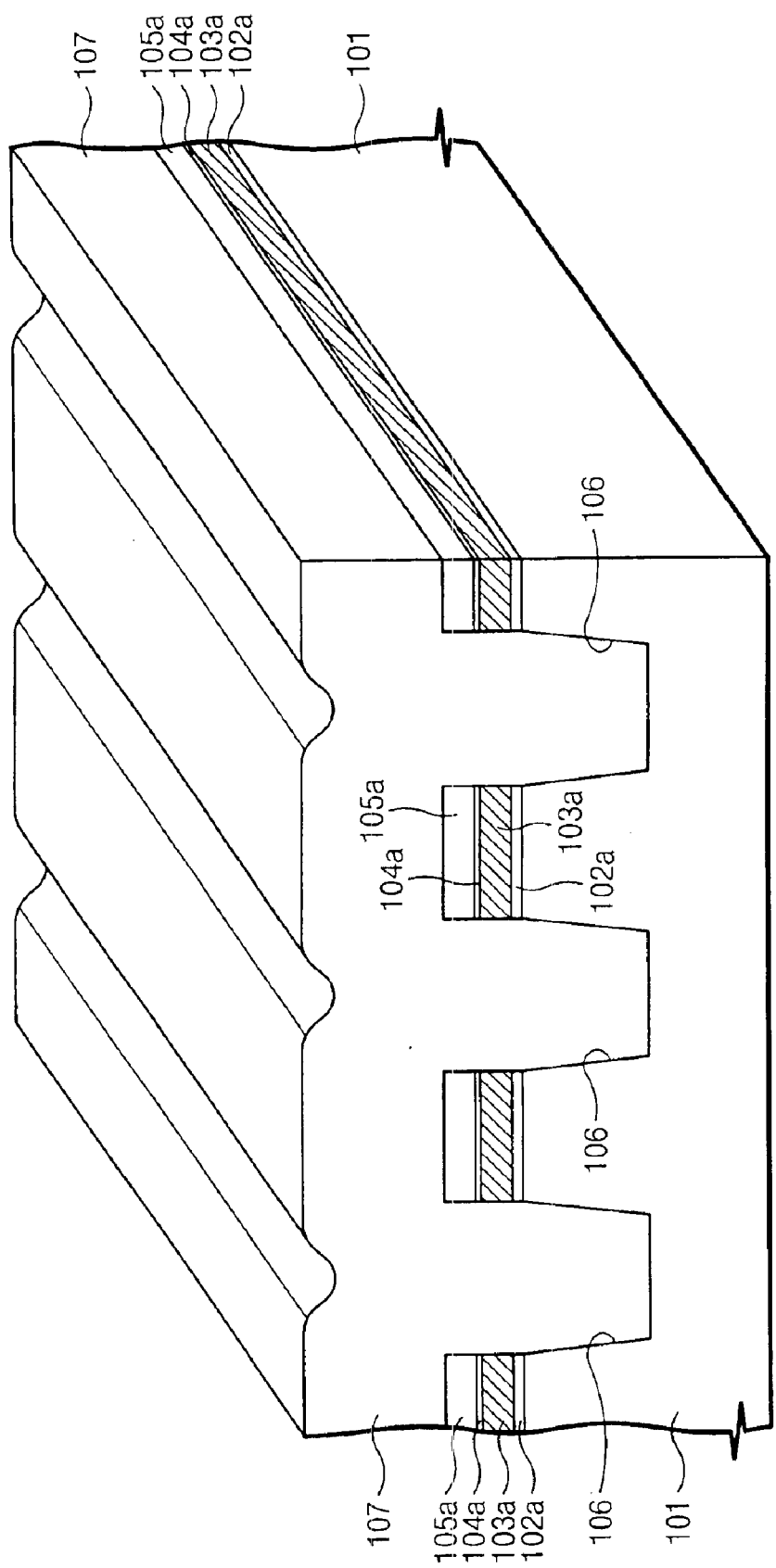

Referring to FIG. 5, the hard mask layer 105, the buffer insulation layer 104, the first floating gate conductive layer 103, and the tunnel insulation layer 102 are successively patterned to expose a region of the semiconductor substrate 101. This patterning forms a tunnel insulation pattern 102a, a first floating gate pattern 103a, a buffer insulation pattern 104a, and a hard mask pattern 105a that are sequentially stacked. The patterns 102a, 103a, 104a, and 105a may be formed to have a line-shape.

Using the hard mask pattern 105 a as a mask, the exposed semiconductor substrate 101 is selectively etched to form a trench 106, which has a predetermined depth from the top of the semiconductor substrate 101. Sidewalls of the trench 106 are aligned with sidewalls of the first floating gate pattern 103a. The trench 106 defines an active region and the first floating gate pattern 103a lies over the active region.

A device isolation insulting layer 107 is formed to fill in the trench 106. The device isolation layer 107 may be formed of silicon oxide, which is used as a general device isolation insulating layer.

Figure 6:
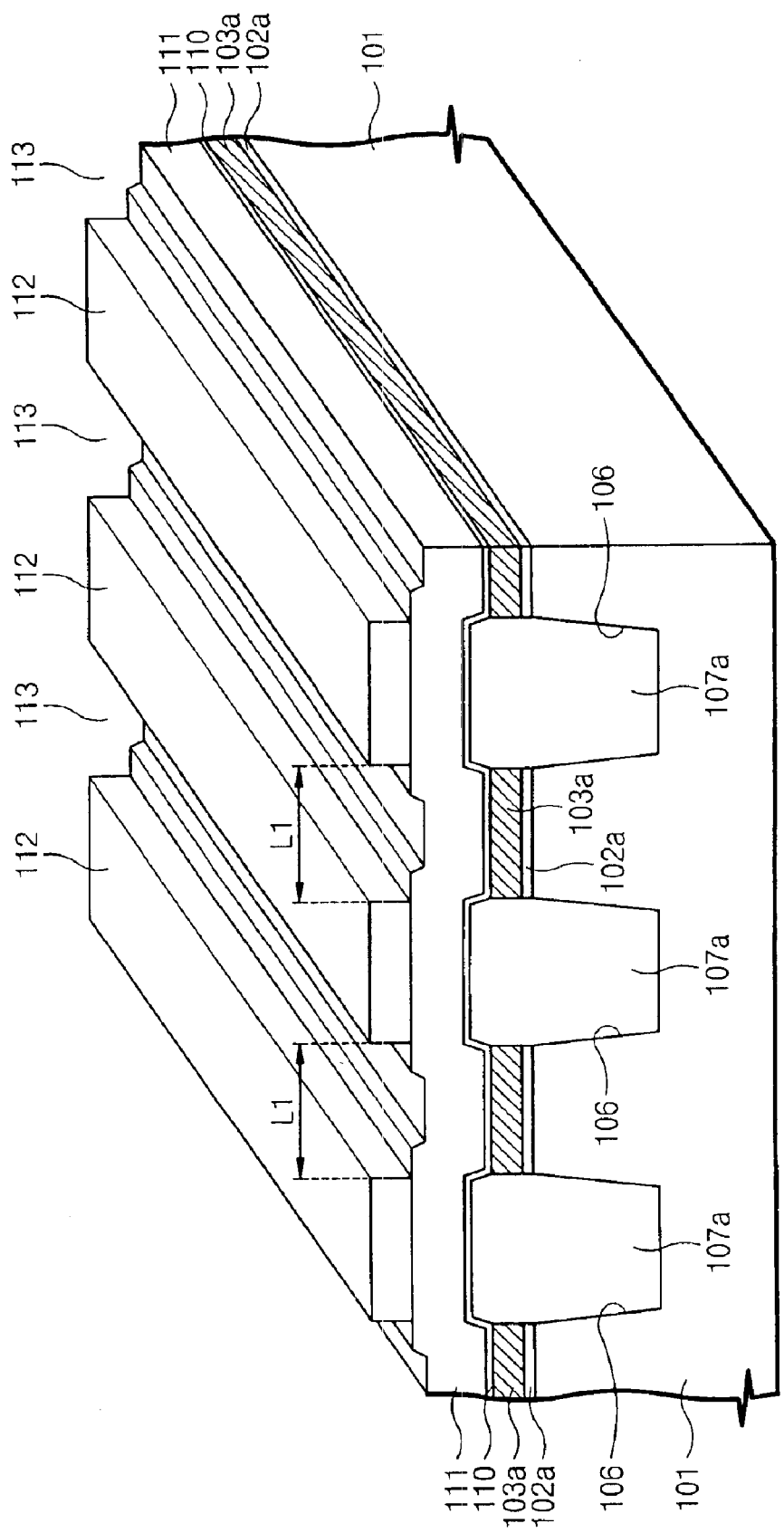

Referring to FIG. 6, the device isolation insulting layer 107 is planarized until the hard mask pattern 105a is exposed, thereby forming a device isolation layer 107a, which continues to fill the trench 106. Next, the exposed hard mask pattern 105a and the buffer insulation layer 104a are etched until the first floating gate pattern 103a is exposed.

An etch stop layer 110 and a mold layer 111 are sequentially formed on the surface of the semiconductor substrate 101 with the exposed first floating gate pattern 103a. The etch stop layer 110 is preferably formed of materials having etch selectivity with respect to the device isolation layer 107a and the first floating gate pattern 103a, for example, silicon nitride. The mold layer 111 is preferably formed of materials having etch selectivity with respect to the etch stop layer 110, for example, silicon oxide. Next, a photoresist pattern 112, including an opening 113, is formed on the mold layer 111. The opening 113 exposes a predetermined region of the mold layer 111. In this embodiment of the present invention, the exposed mold layer 111 lies over the first floating gate pattern 103a. A line width W of the photoresist pattern 112 may become a minimum line width that can be defined in a photolithographic process. Therefore, a width L1 of the opening 113 becomes a maximum width that can be defined in the photolithographic process.

Figure 7:
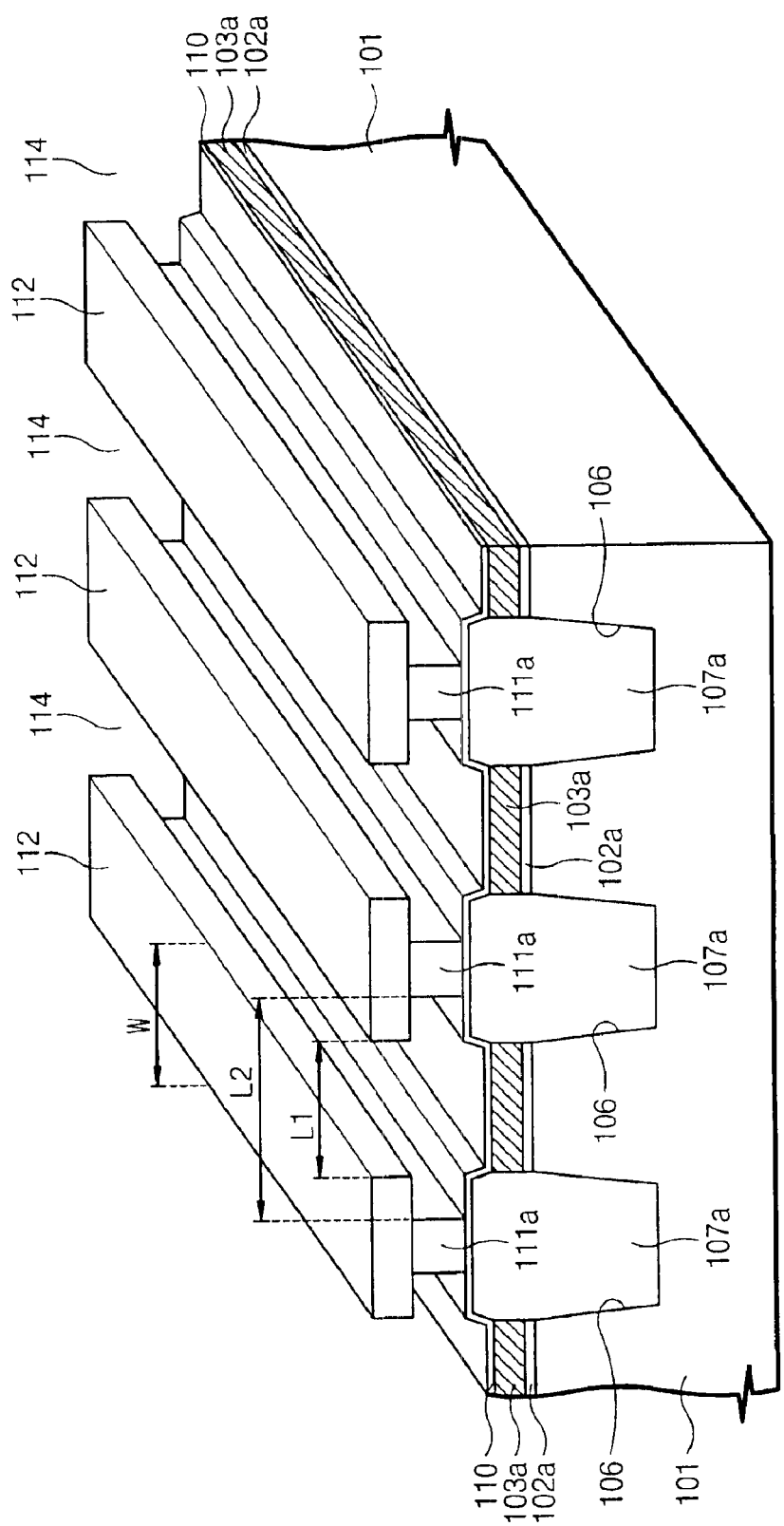
Figure 8:
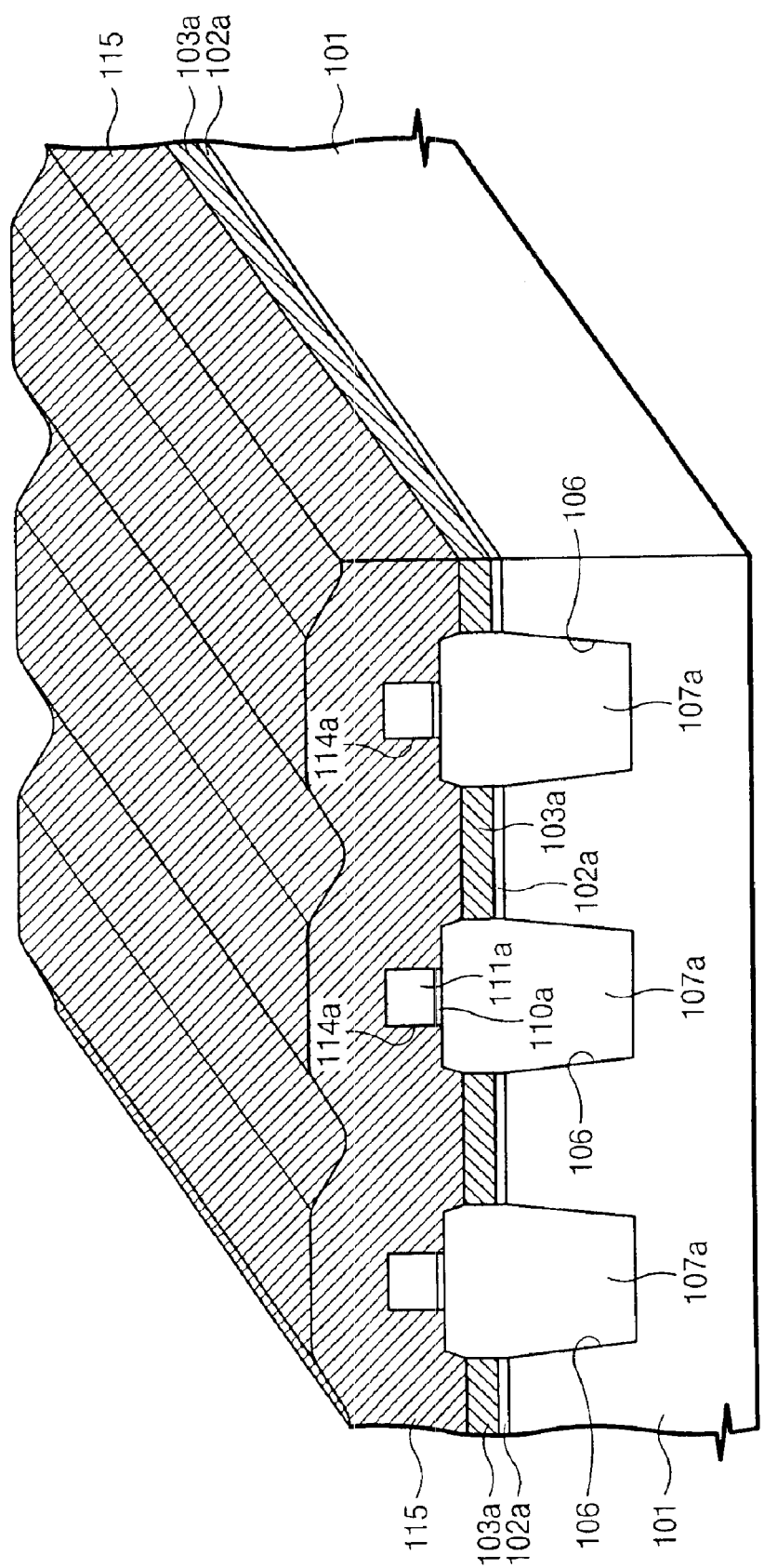

Referring to FIGS. 7 and 8, using the photoresist pattern 112 as a mask, the mold layer 111 is etched by an isotropic etching process, thereby forming a mold pattern 111a including a preliminary groove 114 exposing the etch stop layer 110. A width L2 of the preliminary groove 114 is formed wider than the width L1 of the opening 113 (Refer to FIG. 6) by the isotropic etching. That is to say, the width L2 of the preliminary groove 114 may be formed wider than a maximum interval that can be defined in the photolithographic process (i.e., the width L1 of the opening 113).

In this embodiment, the etch stop layer 110 exposed in the preliminary groove 114 lies on the floating gate pattern 103a and a predetermined region of the device isolation layer 107a, which neighbors the first floating gate pattern 103a.

Referring to FIG. 8, the photoresist pattern 112 on the mold pattern 111a is now removed and the etch stop layer 110 exposed in the preliminary groove 114 is then etched to form a secondary groove 114a. This secondary groove 114a exposes at least the first floating gate pattern 103a. In addition, a predetermined region of the device isolation layer, which neighbors the first floating gate pattern 103a, is preferably exposed. The etch stop pattern 110a is still interposed between the mold pattern 111a and the device isolation layer 107a. This means that the sidewalls of the secondary groove 114a comprise the mold pattern 111a and the etch stop pattern 110a.

A second floating gate conductive layer 115 is formed on the surface of the semiconductor substrate 101 to fill the secondary groove 114a. The second floating gate conductive layer 115 can be formed of doped polysilicon, for example.

Figure 9:
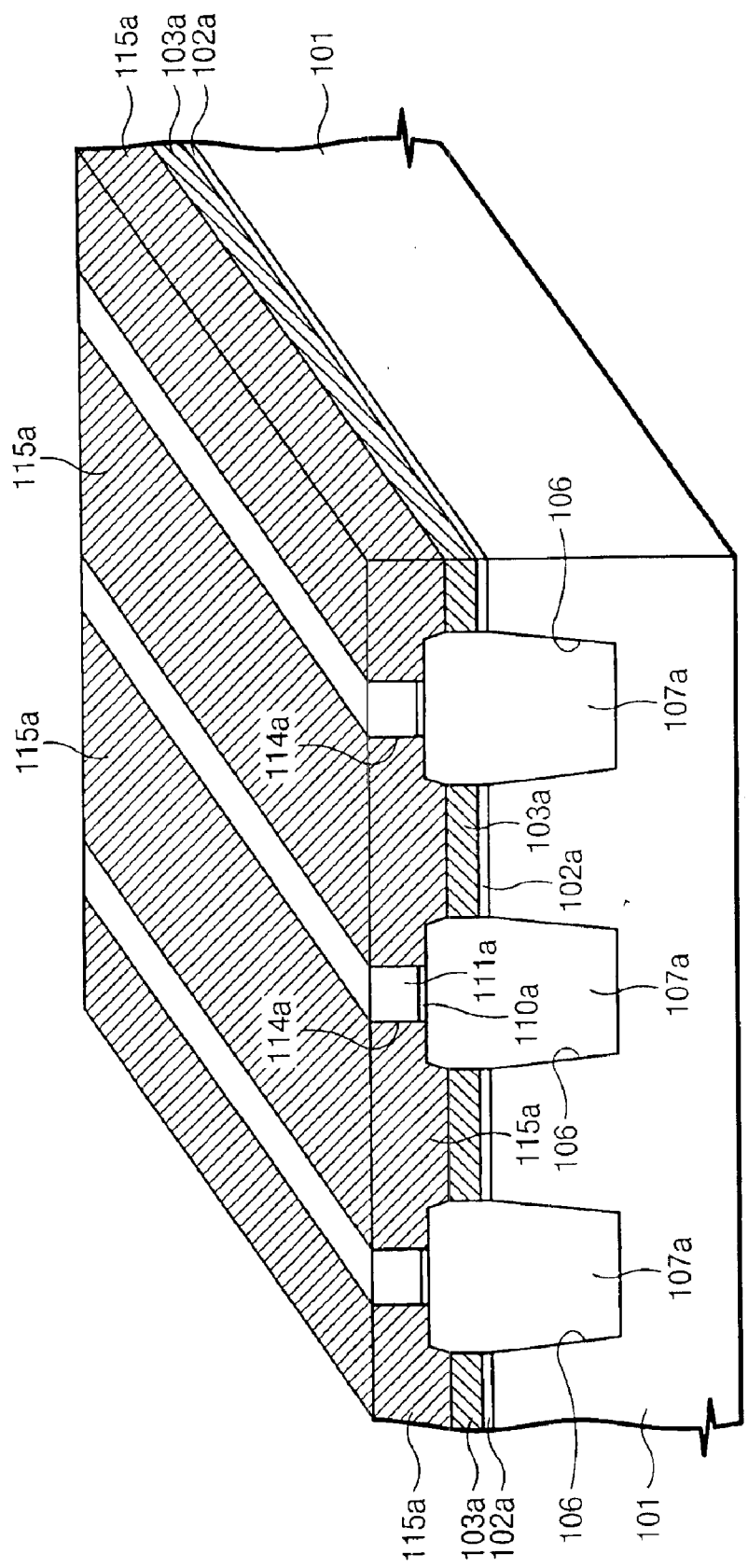
Figure 10:
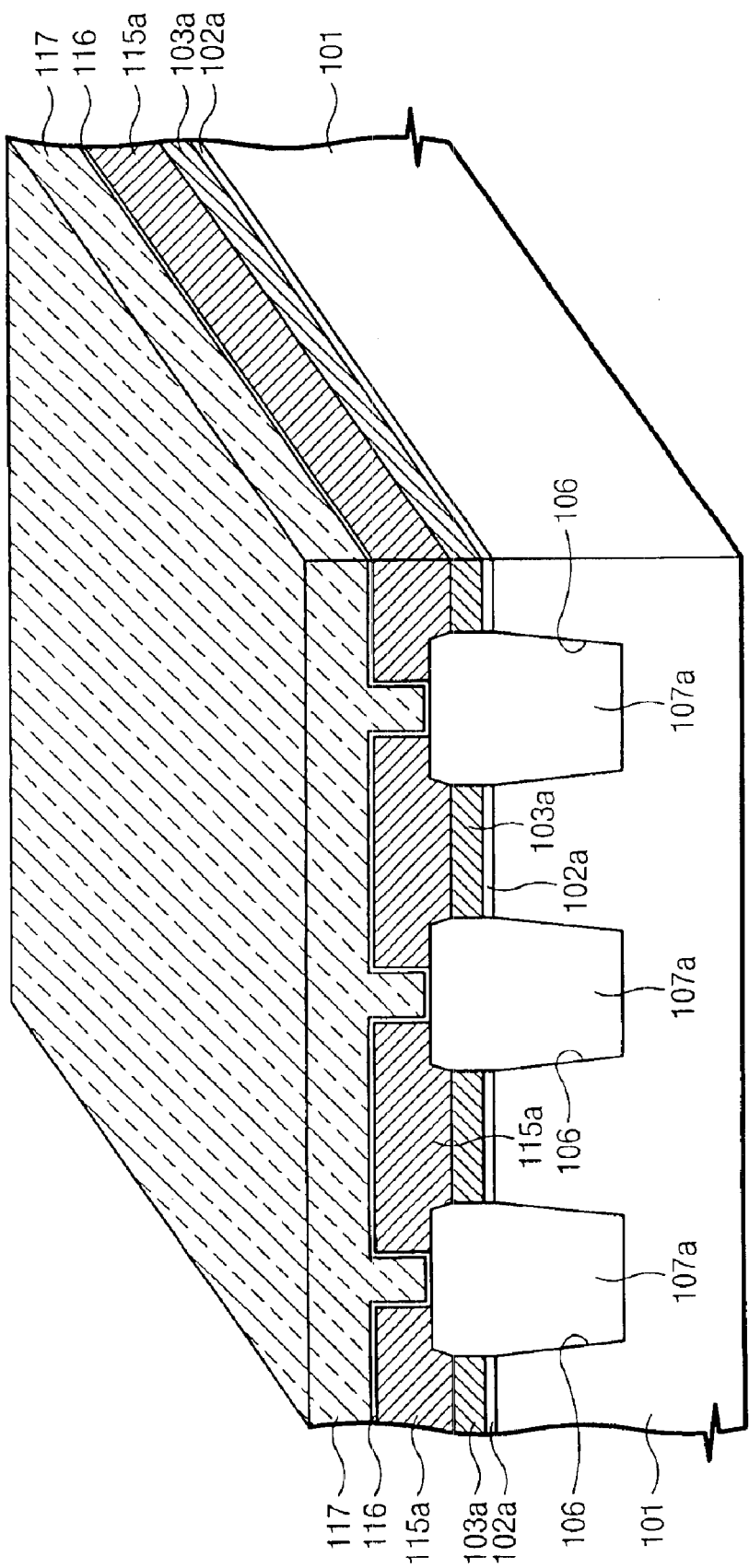
Figure 11:
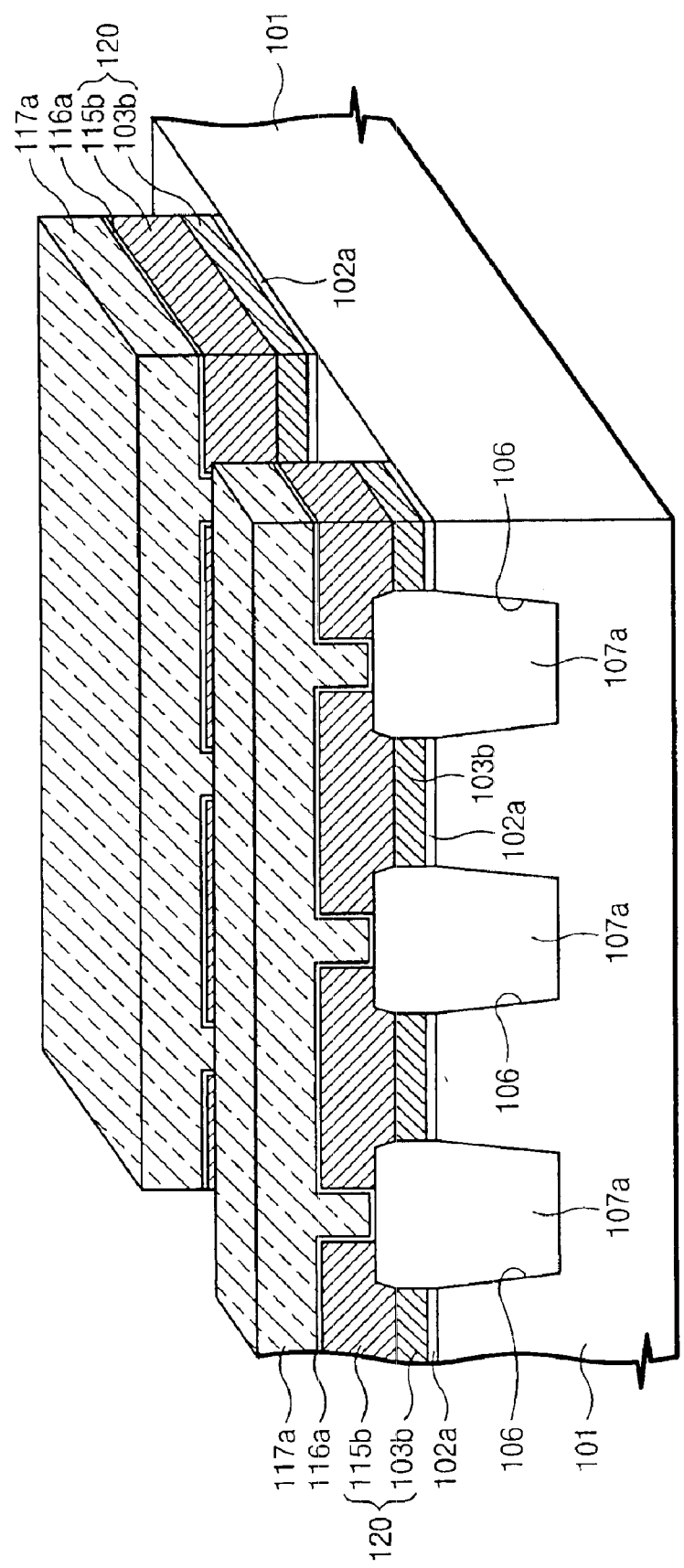

Referring to FIGS. 9, 10, and 11, the second floating gate conductive layer 115 is planarized to expose the mold pattern 111a, thereby forming a second floating gate pattern 115a within the secondary groove 114a. The second floating gate pattern 115a is separated from adjacent second floating gate patterns 115a by the planarization process. Thus, bridges can be prevented. In other words, according to the present invention, a patterning process for forming the second floating gate pattern 115a may not be required. On the contrary, the secondary groove 114a is formed where the second floating gate pattern 115a will be formed. Then, a planarization process is performed to form the second floating gate pattern 115a that fills the secondary groove 114a. Therefore, bridges can be prevented that usually result from regions not being fully etched due to high device integration. The second floating gate pattern can be formed to have a surface area larger than the maximum area that can be defined in the photolithographic process because of the secondary groove 114a. As a result, the coupling ratio of a nonvolatile memory device can be increased and the operation voltage can thereby be decreased.

Referring to FIG. 10, the exposed mold pattern 111a and the etch stop pattern 110a are successively etched to expose the device isolation layer 107a. Therefore, both sidewalls of the second floating gate pattern 115a are exposed. A control gate insulation layer 116 and a control gate conductive layer 117 are conformally formed on the surface of the semiconductor substrate. In this case, the control gate conductive layer 117 may fill spaces between the second floating gate patterns 115a. The control gate insulation layer 116 can be formed of an oxide-nitride-oxide (ONO). Additionally, the control gate insulation layer 116 may be formed of a high-k dielectric that has a higher dielectric constant than ONO. The control gate conductive layer 117 may be formed of a doped polysilicon layer or a polycide layer. A polycide layer comprises a doped polysilicon layer and a metal silicide layer that are sequentially stacked.

Referring to FIG. 11, the control gate conductive layer 117, the control gate insulation layer 116, the second floating gate pattern 115a, and the first floating gate pattern 103a are successively patterned to form a first floating gate electrode 103b, a second floating gate electrode 115b, a control gate insulation pattern 116a, and a control gate electrode 107a that are sequentially stacked. In this case, the tunnel insulation pattern 102a is etched to remain under the first floating gate electrode 103b. The first and second floating gate electrodes 103b and 115b compose the floating gate electrode 120, which along with the control gate electrode 117a, crosses over the active region.

According to the present invention, an etch stop layer and a mold layer are formed on a first floating gate pattern and then successively patterned to form a groove exposing at least the first floating gate pattern. A second floating gate conductive layer is formed to fill the groove and then planarized until the patterned mold layer is exposed, thereby forming a second floating gate pattern. Therefore, bridges can be prevented that usually result from regions not being fully etched due to high device integration. In addition, because the groove is formed by isotropic etching, the area of the second floating gate pattern increases. Also, the nonvolatile memory device can reduce its operational voltage.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method of forming a nonvolatile memory device, the method comprising:

forming a tunnel insulation pattern and a first floating gate pattern that are sequentially stacked on a semiconductor substrate;

forming a trench in the semiconductor substrate;

forming a device isolation layer in the trench;

sequentially forming an etch stop layer and a mold layer on the device isolation layer and on the first floating gate pattern; and successively patterning the mold layer and the etch stop layer to form a groove exposing at least the first floating gate.

2. The method of claim 1, further comprising:

forming a second floating gate pattern that fills the groove.

3. The method of claim 2, wherein forming the second floating gate pattern comprises:

forming a second floating gate conductive layer on the semiconductor substrate to fill in the groove; and planarizing the second floating gate conductive layer to expose the patterned mold layer, thereby forming the second floating gate pattern within the groove.

4. The method of claim 3, further comprising:

etching the patterned mold layer and the patterned etch stop layer until the device isolation layer is exposed;

conformally forming a control gate insulation layer and a control gate conductive layer on the semiconductor substrate including the second floating gate pattern; and successively patterning the control gate conductive layer, the control gate insulation layer, the second floating gate pattern, and the first floating gate pattern to form first and second floating gate electrodes, a control gate insulation pattern, and a control gate that are sequentially stacked, wherein the first and second floating gate electrodes form a floating gate.

5. The method of claim 1, wherein forming the first floating gate pattern and the trench comprises:

sequentially forming a tunnel insulation layer, a first floating gate conductive layer, and a hard mask layer on the semiconductor substrate;

successively patterning the hard mask layer, the first floating gate conductive layer, and the tunnel insulation layer to expose a region of the semiconductor substrate, thereby forming a tunnel insulation pattern, a first floating gate pattern, and a hard mask pattern; and selectively etching the exposed region of the semiconductor substrate to form the trench therein.

6. The method of claim 5, wherein forming the device isolation layer comprises:

forming a device isolation insulating layer that fills the trench;

planarizing the device isolation insulating layer, until the hard mask pattern is exposed, thereby forming a device isolation layer in the trench; and etching the exposed hard mask layer until the first floating gate pattern is exposed.

7. The method of claim 1, wherein the etch stop layer is formed of a material having an etch selectivity with respect to the device isolation layer and the first floating gate pattern.

8. The method of claim 7, wherein the etch stop layer is formed of silicon nitride.

9. The method of claim 1, wherein the mold layer is formed of a material having an etch selectivity with respect to the etch stop layer.

10. The method of claim 9, wherein the mold layer is formed of silicon oxide.

11. The method of claim 1, wherein forming the groove comprises:

forming a photoresist pattern on the mold layer, wherein the photoresist pattern comprises an opening that exposes a region of the mold layer;

isotropically etching the mold layer to form a preliminary groove that exposes the etch stop layer overlying the first floating gate pattern, using the photoresist pattern as a mask;

removing the photoresist pattern from the semiconductor substrate; and etching the etch stop layer exposed in the preliminary groove to form the groove exposing at least the first floating gate pattern.

12. The method of claim 11, wherein the groove is wider than the opening.

13. The method of claim 1, wherein the first and second floating gate patterns are formed of doped polysilicon.

14. A method of forming a nonvolatile memory device, the method comprising:

forming a tunnel insulation pattern and a first floating gate pattern that are sequentially stacked on a semiconductor substrate;

forming a trench in the semiconductor substrate;

forming a device isolation layer in the trench;

sequentially forming an etch stop layer and a mold layer on the device isolation layer and on the first floating gate pattern;

successively patterning the mold layer and the etch stop layer to form a groove exposing at least the first floating gate;

forming a second floating gate conductive layer on the semiconductor substrate to fill in the groove;

planarizing the second floating gate conductive layer to expose the patterned mold layer, thereby forming a second floating gate pattern within the groove;

removing the patterned mold layer and the patterned etch stop layer until the device isolation layer is exposed;

conformally forming a control gate insulation layer and a control gate conductive layer overlying the second floating gate pattern; and successively patterning the control gate conductive layer, the control gate insulation layer, the second floating gate pattern, and the first floating gate pattern to form a floating gate, a control gate insulation pattern, and a control gate.

* * * * *